United States Patent [19]

Blumberg et al.

[11] Patent Number: 4,521,700

[45] Date of Patent: Jun. 4, 1985

[54] TTL LOGIC CIRCUIT EMPLOYING FEEDBACK TO IMPROVED THE SPEED-POWER CURVE

[75] Inventors: Richard J. Blumberg, Poughkeepsie; Stewart Brenner, Wappingers Falls; Rocco J. Robortaccio, Hopewell Junction, all of N.Y.

[73] Assignee: International Business Machines Corporation, Armonk, N.Y.

[21] Appl. No.: 452,541

[22] Filed: Dec. 23, 1982

[51] Int. Cl.³ ............... H03K 19/003; H03K 19/088
[52] U.S. Cl. .................................. 307/456; 307/443; 307/299 A
[58] Field of Search ............. 307/443, 446, 456, 457, 307/458, 466, 299 A

[56] References Cited

U.S. PATENT DOCUMENTS

| | | | |
|---|---|---|---|
| 3,473,047 | 10/1969 | Bohn et al. | 307/456 |
| 3,629,609 | 12/1971 | Pederson et al. | 307/456 |
| 3,676,713 | 7/1972 | Wiedmann | 307/456 |
| 3,693,032 | 9/1972 | Winnard | 307/456 |
| 4,069,428 | 1/1978 | Reedy | 307/299 A X |

*Primary Examiner*—Stanley D. Miller
*Assistant Examiner*—David R. Bertelson
*Attorney, Agent, or Firm*—Wesley DeBruin

[57] ABSTRACT

Disclosed is the addition of passive feedback to a prior art T²L circuit. The T²L circuit with feedback, in accordance with the invention, has a lower power dissipation while retaining noise immunity and small gate delay. The additional resistor required for the feedback T²L circuit, in accordance with the invention, can be incorporated into the T²L cell without increasing the cell size. The feedback T²L circuit, in accordance with the invention, lends itself to the addition of an integrated direct-coupled inverter (DCI) function. The feedback T²L circuit, in accordance with the invention, permits more function to be placed on an integrated circuit semiconductor chip while maintaining gate performance and adherence to power restrictions.

9 Claims, 5 Drawing Figures

T²L CIRCUIT WITH FULL FEEDBACK. ALSO IDEALIZED OUTPUT WAVEFORM (i.e. LOGIC LEVELS).

T²L CIRCUIT WITHOUT FEEDBACK. ALSO IDEALIZED OUTPUT WAVEFORM (i.e. LOGIC LEVELS).

T²L CIRCUIT WITH FULL FEEDBACK. ALSO IDEALIZED OUTPUT WAVEFORM (i.e. LOGIC LEVELS).

T²L CIRCUIT WITH PARTIAL FEEDBACK
(ENHANCED OPERATING RANGE). ALSO IDEALIZED OUTPUT WAVEFORM
(i.e. LOGIC LEVELS).

T²L CIRCUIT WITH PARTIAL FEEDBACK AND
DIRECT-COUPLED CIRCUIT

TTL LOGIC CIRCUIT EMPLOYING FEEDBACK TO IMPROVED THE SPEED-POWER CURVE

FIELD OF THE INVENTION

The invention relates to an improved high speed digital logic circuit and more particularly to an improved high speed digital TTL logic circuit. The logic circuit of the invention lends itself to ready fabrication in integrated circuit form.

BACKGROUND OF THE INVENTION AND PRIOR ART

The operating requirements for integrated circuits employed in performing logic functions are becoming more stringent as the art of digital computers and data processing equipment advances. In particular, the time required for a circuit to perform a logic operation is a limiting factor in the data handling capability of computing apparatus. Problems are also encountered in providing integrated circuits which are sufficiently immune to noise, whether generated within or externally of the circuit. Logic circuits may also be restricted in their usefulness because of limited "fan-out". "Fan-out" is a measure of the number of succeeding logic circuits which can be operated from the output connection of the circuit.

Size is also a significant consideration in the high speed data processing art. A plurality of interconnected logic circuits has been designed for fabrication within a single chip or die of semiconductor material. However, integrated logic circuits have certain problems in addition to those common to logic circuits in general. The ability to dissipate power is limited, and this situation may result in restricting the circuit to low fan-out and/or large gate delays. Since all of the individual circuit elements (e.g. transistors, diodes, resistors etc.) are located on a single small piece of semiconductor material (i.e. a chip), there are wireability considerations which must be taken into account.

Various types of digital logic circuits have been developed for fabrication as integrated circuits. Of these, the so-called transistor-transistor logic type (TTL) has become widely accepted because of the availability of certain circuits having favorable switching speeds, power dissipation, immunity to noise, fan-out, and capacitive load driving capability. The TTL technology is well known in the art. A sizeable number of patents, publications and texts disclose and discuss the design of TTL circuits. Reference is made, for example, to the texts:

(1) "Designing with TTL Integrated Circuits" by R. L. Morris and J. R. Miller, McGraw Hill, New York, N.Y., Copyright 1971; and (2) "Digital Integrated Electronics" by Herbert Taub and Donald Schilling, McGraw Hill, New York, N.Y., Copyright 1977.

The patents and publications fully identified hereinafter disclose TTL type circuitry. These patents and publications do not constitute all of the patents and publications directed to TTL circuits, nor are they represented to include the most pertinent prior art to the invention disclosed hereinafter.

U.S. Pat. No. 3,229,119 entitled "Transistor Logic Circuits" granted Jan. 11, 1966 to R. E. Bohn et al. U.S. Pat. No. 3,283,170 entitled "Coupling Transistor Logic and Other Circuits" granted Nov. 1, 1966 to J. L. Buie. U.S. Pat. No. 3,473,047 entitled "High Speed Digital Logic Circuit Having Non-Saturating Output Transistor" granted Oct. 14, 1969 to R. E. Bohn et al. U.S. Pat. No. 3,524,992 entitled "Transistor Logic Circuit" granted Aug. 18, 1970 to J. J. Kardash. U.S. Pat. No. 3,555,294 entitled "Transistor—Transistor Logic Circuits Having Improved Voltage Transfer Characteristic" granted Jan. 12, 1971 to R. L. Treadway. U.S. Pat. No. 3,571,616 entitled "Logic Circuit" granted Mar. 23, 1971 to J. R. Andrews. U.S. Pat. No. 3,629,609 entitled "TTL Input Array with Bypass Diode" granted Dec. 21, 1971 to R. A. Pedersen. U.S. Pat. No. 3,693,032 entitled "Antisaturation Technique for TTL Circuits" granted Sept. 19, 1972 to J. R. Winnard. U.S. Pat. No. 3,934,157 entitled "TTL Circuit" granted Jan. 20, 1976 to W. J. Evans. U.S. Pat. No. 3,962,590 entitled "TTL Compatible Logic Gate Circuit" granted June 8, 1976 to J. Kane et al. U.S. Pat. No. 3,999,080 entitled "Transistor Coupled Logic Circuit" granted Dec. 21, 1976 to S. Weatherby Jr. et al. U.S. Pat. No. 4,049,975 entitled "Transistor Circuit" granted Sept. 20, 1977 to S. F. Colaco. U.S. Pat. No. 4,069,428 entitled "Transistor-Transistor-Logic Circuit" granted Jan. 17, 1978 to D. C. Reedy. U.S. Pat. No. 4,287,433 entitled "Transistor Logic Tristate Output With Reduced Power Dissipation" granted Sept. 1, 1981 to S. N. Goodspeed. U.S. Pat. No. 4,321,490 entitled "Transistor Logic Output For Reduced Power Consumption and Increased Speed During Low to High Transition" granted Mar. 23, 1982 to R. W. Bechdolt.

IBM Technical Disclosure Bulletin Publications: "Circuit Biasing Techniques" by J. B. Atkins, Vol. 8, No. 9, February 1966, page 1293. "Emitter-Follower Current Switch With In-Phase Feedback" by K. F. Mathews, Vol. 9, No. 3, August 1966 pages 322-4. "Unsaturated Transistor Logic Gate" by S. Wiedmann, Vol. 12, No. 11, April 1970, pages 2010-11. "Antisaturation Circuit" by J. A. Palmieri, Vol. 13, No. 2, July 1970, page 428. "Circuit With Negative Feedback" by L. C. Wu, Vol. 13, No. 2, July 1970, page 435. "Antisaturation TTL Circuit" by H. D. Varadarojan, Vol. 14, No. 1, June 1971, page 335. "Speed Up of TTL Circuits" by J. E. Gersbach, Vol. 14, No. 6, November 1971, page 1685. "Low Voltage $T^2L$ Circuit by K. P. Johnson et al, Vol. 14, No. 10, March 1972, page 2859-0. "Low-Input Leakage $T^2L$ Circuit by E. F. Culican, Vol. 14, No. 12, May 1972, pages 3681-2. "Transistor-Transistor Logic Circuit" by H. H. Berger et al, Vol. 16, No. 8, January 1974, pages 2643. "Microwatt TTL Circuits" by S. J. Aohi et al, Vol. 16, No. 10, March 1974, page 3273. "High-Input Impedance TTL Receiver Circuit" by R. F. Sechler, Vol. 18, No. 12, May 1976, pages 4088-0. "Constant-Current TTL Circuit" by W. Change et al, Vol. 19, No. 4, September 1976, page 1234. "Push-Pull $T^2L$ Internal Circuit" by A. H. Dansky, Vol. 23, No. 4, September 1980, pages 1431-2. "N-Way AND Circuit and Multiplex Circuit for $T^2L$ Family" by H. Beranger, Vol. 25, No. 1, June 1982, pages 334-5.

SUMMARY OF THE INVENTION

The invention may be summarized as the addition of feedback to a conventional $T^2L$ circuit in order to lower power dissipation and retain noise immunity, with no sacrifice in the delay (speed) characteristic of the modified $T^2L$ circuit.

Correspondingly, in accordance with the invention, the addition of feedback to a conventional $T^2L$ circuit may be utilized to enhance the delay (speed) characteristic while maintaining the same power dissipation and retaining noise immunity of the modified $T^2$ circuit.

It is an object of the present invention to provide an improved logic circuit.

It is a further object of the present invention to provide an improved TTL logic circuit.

It is a further object of the present invention to provided a TTL logic circuit having an enhanced "Speed-Power Product" curve.

It is an object of the present invention to provide an improved TTL circuit utilizing at least partial feedback of a portion of the output signal to the input of the output stage.

BRIEF DESCRIPTION OF THE DRAWINGS

The foregoing and other objects, features, and advantages of this invention will be apparent from the following more particular description of the preferred embodiments of the invention as illustrated in the accompanying drawings.

DETAILED DESCRIPTION OF THE INVENTION

Figure 1:
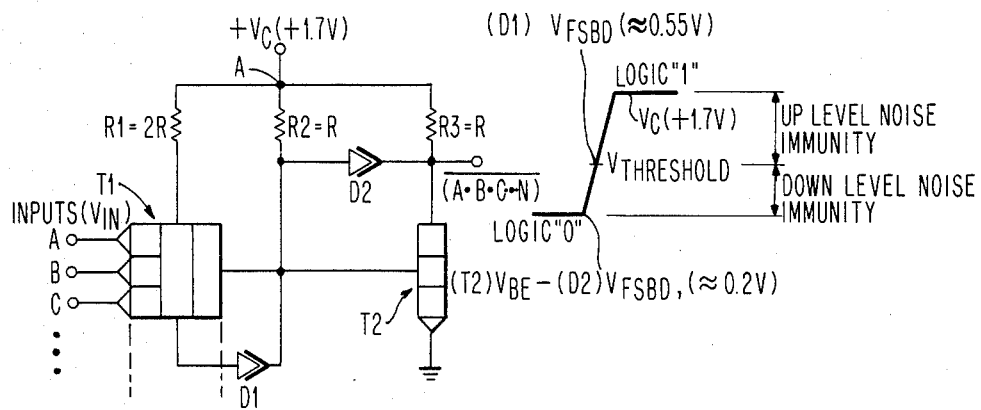
FIG. 1 is a prior art $T^2L$ circuit diagram and the idealized output waveform thereof showing logic levels.

FIG. 1 shows a prior art $T^2L$ circuit employing a multi-emitter input transistor T1. The emitters A,B,C,—n of transistor T1 respectively receive logical binary inputs "1" or "0". The binary inputs ("1" or "0") impressed on A,B,C— - - n are respectively voltage levels of approximately +Vc (1.7) volts for a binary "1" and approximately 0.2 volts for a binary "0". Transistor T1 has its base connected via resistor R1 to a first source of potential +Vc having magnitude of 1.7 V. The collector of transistor T1 is coupled via resistor R2 to the first potential source +Vc. The Schottky barrier diode D1 has its anode connected to the base of transistor T1 and its cathode connected to the collector of T1. Output transistor T2 has its collector connected via resistor R3 to the first potential source +Vc, its base connected to the collector of the input transistor T1, and its emitter connected to a second source of potential having a magnitude of zero volts (ground). A Schottky barrier diode D2 has its anode connected to the base of transistor T2 and its cathode connected to the collector of output transistor T2. In the $T^2L$ circuit of FIG. 1 the resistors R1, R2, and R3 have the following approximate relative magnitudes of 2R ohms, R ohms and R ohms respectively, where R has a value of approximately 5000 (5K) ohms. The output of the $T^2L$ circuit of FIG. 1 is the NAND logical function $(\overline{A \cdot B \cdot C \text{—} \cdot n})$ and is manifested as a potential at an output terminal connected to the collector of T2.

It is to be appreciated that in regard to the prior art $T^2L$ circuit of FIG. 1 and applicants' invention as fully described hereinafter, the express disclosure of resistance values and potential magnitudes is solely for convenience of explanation and understanding of applicants' invention. Clearly, applicants' invention is not to be limited to these resistor values and magnitudes of potential. The preferred resistance ratios of the resistor values, i.e. R1 to R2 to R3 etc. throughout the specification are preferred ratios and applicants' invention is not intended to be limited to these precise ratio.

Figure 2:
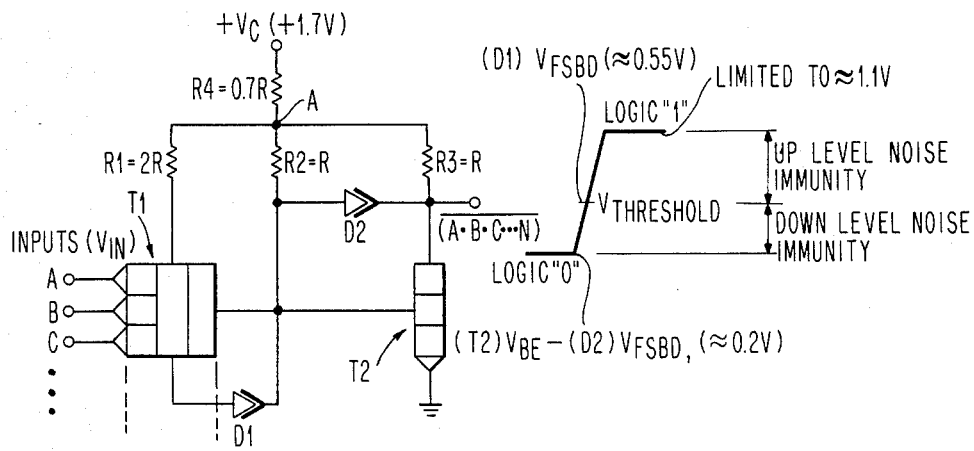
FIG. 2, in accordance with the invention, is a $T^2L$ circuit having full feedback and the idealized output waveform thereof showing logic levels.

Reference is made to FIG. 2 which, in accordance with the invention, shows a $T^2L$ circuit having full feedback. In FIGS. 1 and 2, as well as throughout this specification, like reference characters (T1, T2, R1, R2, etc.) make reference to like structure and circuit components. In FIG. 2, as in FIG. 1, resistors R1, R2 and R3 are each connected to node A. However, in FIG. 1 node A is connected directly to the first source of potential (+Vc) whereas in FIG. 2 node A is connected via resistor R4 to the first source of potential (+Vc). In FIG. 2 the resistors have the following approximate relative magnitudes R1=2R, R2=R, R3=R and R4=0.7R, where R is approximately equal to 5000 (5K) ohms. As in FIG. 1, the output of the $T^2L$ circuit of FIG. 2 is the NAND logical function $(\overline{A \cdot B \cdot C \text{—} \cdot n})$ and is manifested as a potential at an output terminal connected to the collector of T2.

Figure 3:
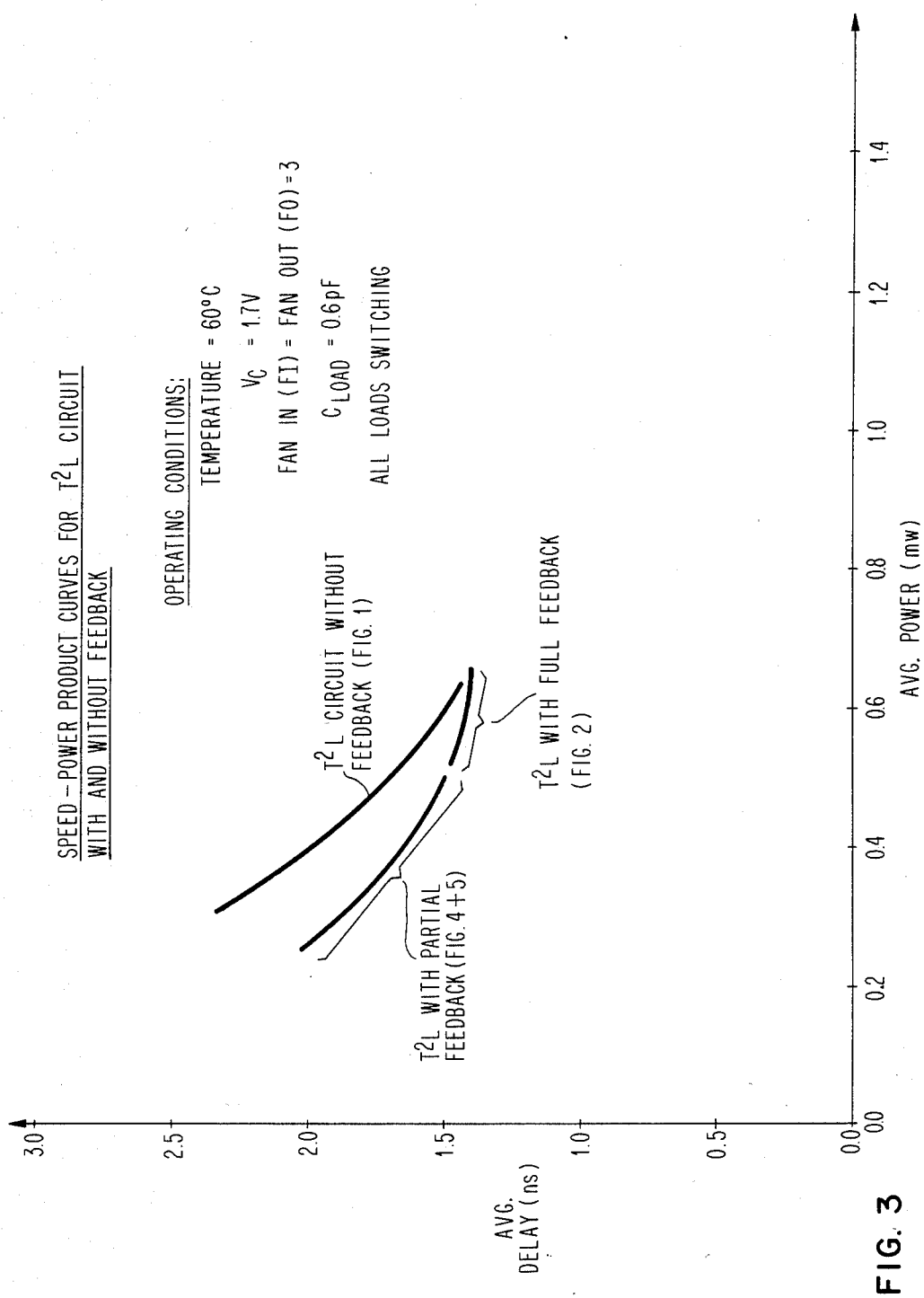
FIG. 3 discloses speed power product curves for a prior art $T^2L$ circuit without feedback (FIG. 1), a $T^2L$ circuit with full feedback (FIG. 2), and a $T^2L$ circuit having partial feedback (FIGS. 4 and 5).
Figure 4:
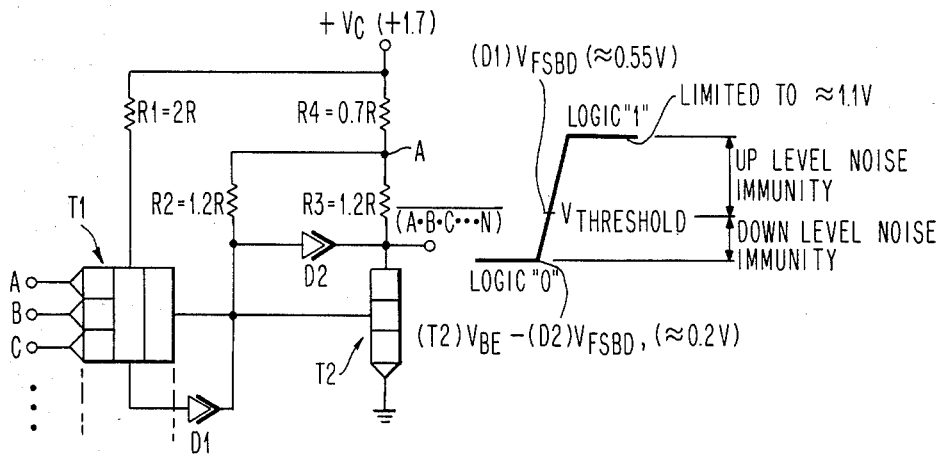
FIG. 4, in accordance with the invention, is a $T^2L$ circuit having partial feedback, and the idealized output waveform thereof showing logic levels.
Figure 5:
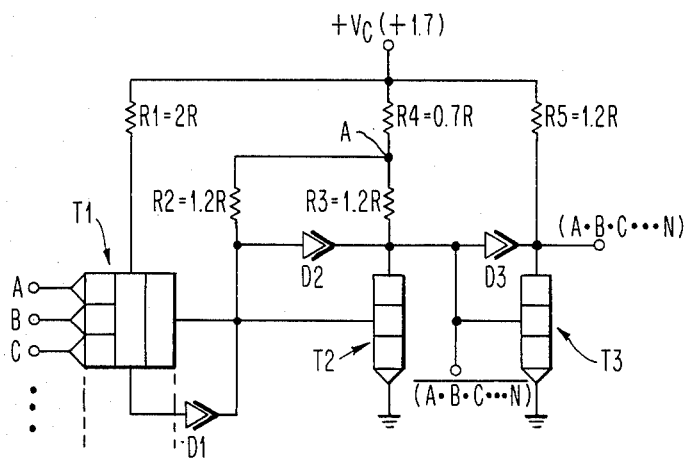
FIG. 5, in accordance with the invention, is a $T^2L$ circuit having partial feedback. The $T^2L$ circuit includes a direct-coupled inverter.

Reference is made to FIGS. 4 and 5 which, in accordance with the invention, respectively show a $T^2L$ circuit having partial feedback. In FIGS. 4 and 5 resistor R1 is connected to the first source of potential (+Vc) whereas in FIG. 3 R1 is connected to electrical node A. The $T^2L$ circuits with partial feedback, shown in FIGS. 4 and 5, correspond one to the other with the exception that the $T^2L$ circuit of FIG. 5 includes a direct-coupled inverter circuit for providing as an additional output the logical AND function (A·B·C— - - ·n). The output inverter of the $T^2L$ circuit of FIG. 5 includes a transistor T3 having, its base connected to the collector of transistor T2, its collector connected via resistor R5 to the first potential source (+Vc), and its emitter connected to the second potential source (ground). The relative resistor magnitudes for R1, R2, R3, and R4 of FIGS. 4 and 5, and R5 of FIG. 5, are R1=2R, R2=1.2R, R3=1.2R, R4=0.7R, and R5=1.2R. The $T^2L$ circuit of FIG. 5 provides the logical NAND function $(\overline{A \cdot B \cdot C \text{—} \text{ - - } \cdot n})$ and the logical AND function (A·B·C— - - ·n).

Reference is made to the graph of FIG. 3 wherein speed power product curves for a $T^2L$ circuit without feedback, a $T^2L$ circuit with full feedback, and a $T^2L$ circuit with partial feedback are respectively depicted. In FIG. 3 the average power is plotted along the abscissa (x-axis) in milliwatts and the average delay in nanoseconds is plotted along the ordinate (y-axis). From an inspection of FIG. 3 it will be readily apparent that for a given speed, such as 1.5 nanoseconds, a $T^2L$ circuit with partial feedback requires less power than a $T^2L$ circuit without feedback. It will also be apparent that over the optimized range a $T^2L$ circuit with partial or full feedback, for a given speed (or delay), will require less power than a $T^2L$ circuit without feedback and like speed. Correspondingly, for a given circuit power, it will be seen from FIG. 3 that a $T^2L$ circuit with partial or full feedback will function at a higher speed (lower delay). Also from FIG. 3, it will be apparent that partial feedback in T²L circuits is preferable to full feedback.

VLSI results in more logic function being placed on a single chip. This increase in functional density per semiconductor chip reduces overall component count and cost, and enhances system reliability. However, as more circuits are placed on a single chip, the power dissipation requirements per chip rapidly exceed the capability of the package to effectively transfer the heat generated to the cooling medium. Circuit power levels can be lowered, but this is accompanied by an unacceptable reduction in circuit performance. What is needed in VLSI, especially in low-end applications where extraordinary cooling techniques are prohibitive in cost, is a circuit with both low power dissipation and small block delay. The disclosed invention addresses this problem by providing a novel T²L circuit. The novel T²L circuit employs feedback and preferably partial feedback.

In accordance with the invention, the addition of passive feedback to a prior art T²L circuit results in an improved T²L circuit. The improved T²L circuit retains the noise immunity and performance of the prior art T²L circuit but reduces the power dissipation. Namely, the improved T²L circuit has an enhanced "Speed-Power Product" curve as compared to the prior art T²L circuit.

Shown in FIG. 1 is a prior art T²L circuit and logic levels generated by same. A DOWN level or logical "0" is equal to $(T2)V_{BE}-(D2)V_{FSBD}$, ($\approx 0.2$ V). The threshold ($V_{threshold}$) of the circuit is equal to $(T2)V_{BE}+(D1)V_{FSBD}-(T1)V_{BE}\approx(D1)V_{FSBD}$ ($\approx 0.55$ V). The UP level, or logical "1", is equal to the $+Vc$ supply voltage (1.7 V). The D.C. noise immunity of the circuit is defined as the difference between the operating point (i.e. a logical "0" or logical "1" level) and the circuit's switching point, $V_{threshold}$. As can be seen from FIG. 1, the UP level and DOWN level noise immunities for the prior art T²L circuit are unequal. The DOWN level noise immunity of the T²L circuit of FIG. 1 is less than the UP level noise immunity, and as such, establishes the noise immunity of the circuit. It follows that in magnitude, the portion of the UP level immunity which exceeds in magnitude the DOWN level immunity cannot be fully utilized, and is unnecessary and wasteful from a power dissipation point of view. The excess portion of the UP level immunity consumes power since a higher voltage than is necessary is achieved. This additional unnecessary consumption of power by the circuit of FIG. 1 adds to the heat dissipation problem of VLSI as discussed earlier herein. The higher output voltage (UP level) of the circuit of FIG. 1 also results in additional time delay since the next stage (circuit connected to output of circuit under discussion) must wait for the signal to fall from the unnecessarily high voltage to $V_{threshold}$ before it will begin to switch. What is needed is a means of limiting the UP level at a voltage lower than the $+Vc$ supply. Namely, a lower UP level which will provide a more symmetric transfer curve. Such a T²L circuit along with its approximately symmetric output (UP and DOWN) levels is shown in FIG. 2.

In the T²L circuit of FIG. 2 the addition of one resistor (R4) creates a voltage divider network which limits the output UP level at a value equal to:

$$\frac{R2}{R2+R4}[V_C - V_{IN} - (T1)V_{BE} + (D1)V_{FSBD}] + V_{IN} +$$

-continued $$(T1)V_{BE} - (D1)V_{FSBD}.$$

We have discovered that desirable values for the resistors and Vc of the T²L circuit of FIG. 2 are as follows: R1=2R, R2=R and R3=R (where R is 5 k ohms), and Vc is +1.7 volts. Referring to FIG. 3 the impressive gains in "Speed-Power" product for the circuits of FIGS. 2, 4 and 5 will be apparent. For example, assuming a fixed block delay of 1.75 ns the T²L circuit of FIG. 1 (prior art) will dissipate 0.465 milliwatts while the feedback T²L circuit of FIG. 4 will dissipate only 0.34 mw. This is a power savings of 28 percent.

We have determined from out studies that for chips containing several thousand gates (T²L circuits) per semiconductor chip, the cell size is determined by the number and size of the wiring tracks or channels needed to interconnect the gates on the chip. The additional resistor required for a T²L circuit having feedback may be readily incorporated into the cell without materially enlarging the cell size, which would in turn unfavorably impact chip density. The semiconductor devices (transistors, resistors, and Schottky diodes) required per T²L circuit may be densely placed on a semiconductor chip due to the power saving per circuit. Thus a sizeable number of devices, resulting in additional T²L circuits, may be fabricated on each semiconductor chip.

In order to be useful a circuit must operate over the widest possible range of environmental conditions (power supply and temperature) and process variations. The circuit of FIG. 2 may be modified as shown in FIG. 4. Moving the base resistor R1 out of the feedback path has a negligible effect upon power dissipation, but significantly extends the range of circuit operation. Referring to FIG. 4, a small adjustment to R2 and R3 (for example, R2=R3=1.2R, where R=5 k ohms) will provide a slightly less than optimum A.C. design, but the D.C. fanout capability is increased by as much as 40%.

As discussed earlier herein the cell contains a number of devices (i.e. transistors, resistors, and diodes). One more transistor and resistor, as shown in the circuit of FIG. 5, will make it possible to offer a direct-coupled inverter (DCI) in the same cell as the T²L NAND circuit of FIG. 4. Typically, 10 to 30% of the circuit count of a single-phase logic technology (e.g. T²L) is dedicated to performing the invert or "not" function. It is thus possible to integrate the invert function (FIG. 5) into the same cell as the feedback T²L circuit (FIG. 4), leaving circuits available on chip for additional logic function. It will thus be appreciated that the preferred embodiments of the invention are shown in FIGS. 4 and 5.

While the invention has been particularly shown and described with reference to preferred embodiments, it will be understood by those skilled in the art that various changes in form and detail may be made therein without departing from the spirit and scope of the invention.

We claim:
1. An improved T²L circuit employing partial feedback and having enhanced operating characteristics, said improved T²L circuit comprising:
a first transistor having a collector, base, and at least first, second, and third emitters, said first, second, and third emitters of said first transistor respectively receiving a logical binary input A, B, and C;

a second transistor having an emitter, base, and collector, said emitter of said second transistor being connected to a first potential source, said base of said second transistor being connected to said collector of said first transistor;

a first resistor connected between said base of said first transistor and a second potential source;

second and third resistors serially connected between said base of said second transistor and said collector of said second transistor;

a fourth resistor connected between the junction of said second and third resistors and said second potential source; and an output terminal connected to said collector of said second transistor, said output terminal manifesting the logical binary function $\overline{A \cdot B \cdot C}$.

2. An improved T²L circuit employing partial feedback and having enhanced operating characteristics, as recited in claim 1, wherein said first resistor has an ohmic resistance of approximately 2R ohms, said second resistor has an ohmic resistance of approximately 1.2R ohms, said third resistor has an ohmic resistance of approximately 1.2R ohms, said fourth resistor has an ohmic resistance of approximately 0.7R ohms, and said potential provided by said second potential source is greater in magnitude than said potential of said first potential source.

3. An improved T²L circuit employing feedback and having enhanced operating characteristics, said improved T²L circuit comprising:

a first transistor having a collector, base and at least first, second, and third emitters, said first, second, and third emitters of said first transistor respectively receiving a logical binary input A, B, and C;

a second transistor having an emitter, base and collector, said emitter of said second transistor being connected to a first potential source, said base of said second transistor being connected to said collector of said first transistor;

a first resistor connected between said base of said first transistor and an electrical node;

second and third resistors serially connected between said base of said second transistor and said collector of said second transistor, said juncture of said second and third resistors constituting said electrical node;

a fourth resistor connected between the junction (electrical node) of said first, second, and third resistors and a second potential source; and an output terminal connected to said collector of said second transistor, said output terminal manifesting the logical binary function $\overline{A \cdot B \cdot C}$.

4. An improved T²L circuit employing feedback and having enhanced operating characteristics, as recited in claim 3, wherein said first resistor has an ohmic resistance of approximately 2R ohms, said second resistor has an ohmic resistance of approximately R ohms, said third resistor has an ohmic resistance of approximately R ohms, said fourth resistor has an ohmic resistance of approximately 0.7R ohms, and said potential provided by said second potential source is greater in magnitude than said potential of said first potential source.

5. An improved T²L circuit employing partial feedback and having enhanced operating characteristics, said improved T²L logic circuit comprising:

a first transistor having a collector, base, and at least first, second, and third emitters, said first, second, and third emitters of said first transistor respectively receiving a logical binary input A, B, and C;

a second transistor having an emitter, base, and collector, said emitter of said second transistor being connected to a first potential source, said base of said second transistor being connected to said collector of said first transistor;

a third transistor having an emitter, base, and collector, said emitter of said third transistor being connected to said first potential source, said base of said third transistor being connected to said collector of said second transistor;

a first resistor connected between said base of said first transistor and a second source of potential, second and third resistors serially connected between said base of said second transistor and said collector of said second transistor;

a fourth resistor serially connected between the junction of said second and third resistors and said second potential source;

a fifth resistor connected between said collector of said third transistor and said second potential source;

a first output terminal connected to said collector of said second transistor, said first output terminal manifesting the logical binary function A·B·C in response to said first, second, and third emitters of said first transistor having respectively impressed thereon the logical binary inputs A, B, and C; and, a second output terminal connected to said collector of said third transistor, said second output terminal manifesting the logical binary function A·B·C in response to said first, second and third emitters of said first transistor having respectively impressed thereon the logical binary inputs A, B and C.

6. An improved T²L circuit employing partial feedback and having enhanced operating characteristics, as recited in claim 5, wherein said first resistor has an ohmic resistance of approximately 2R ohms, said second resistor has an ohmic resistance of approximately 1.2R ohms, said third resistor has an ohmic resistance of approximately 1.2R ohms, said fourth resistor has an ohmic resistance of approximately 0.7 ohms, said fifth resistor has an ohmic resistance of approximately 1.2R ohms, and said potential provided by said second potential source is greater in magnitude than said potential of said first potential source.

7. An improved T²L circuit employing feedback and having enhanced operating characteristics, as recited in claims 2, 4, and 6 wherein R has an ohmic value of approximately 5 K ohms, the first potential source provides a potential Vee and said second potential source provides a potential Vc.

8. An improved T²L circuit employing feedback and having enhanced operating characteristics, as recited in claim 7, wherein Vc has a magnitude of approximately +1.7 volts and Vee has a magnitude of approximately zero (0) volts.

9. An improved T²L circuit employing feedback and having enhanced operating characteristics, as recited in claim 8, wherein a first Schottky barrier diode is connected across said base-collector junction of said first transistor and a second Schottky barrier diode is connected across said base-collector junction of said second transistor.

* * * * *